(12) United States Patent
Luan

(10) Patent No.: US 9,466,557 B2
(45) Date of Patent: Oct. 11, 2016

(54) ELECTRONIC DEVICE WITH FIRST AND SECOND CONTACT PADS AND RELATED METHODS

(71) Applicant: STMICROELECTRONICS (SHENZHEN) R&D CO., LTD., Shenzhen (CN)

(72) Inventor: Jing-En Luan, Shenzhen (CN)

(73) Assignee: STMICROELECTRONICS (SHENZHEN) R&D CO. LTD, Shenzhen (CN)

( * ) Notice: Subject to any disclaimer, the term of this patent is extended or adjusted under 35 U.S.C. 154(b) by 0 days.

(21) Appl. No.: 14/984,082

(22) Filed: Dec. 30, 2015

(65) Prior Publication Data
US 2016/0111354 A1    Apr. 21, 2016

Related U.S. Application Data

(63) Continuation of application No. 14/547,459, filed on Nov. 19, 2014.

(30) Foreign Application Priority Data

Nov. 29, 2013   (CN) .......................... 2013 1 0629973
Nov. 29, 2013   (CN) .................... 2013 2 0783051 U

(51) Int. Cl.
*H01L 23/495*    (2006.01)
*H01L 23/00*     (2006.01)
(Continued)

(52) U.S. Cl.
CPC ......... *H01L 23/49541* (2013.01); *H01L 21/56* (2013.01); *H01L 23/3114* (2013.01); *H01L 23/3675* (2013.01); *H01L 23/4334* (2013.01); *H01L 23/481* (2013.01); *H01L 23/49503* (2013.01); *H01L 23/49548* (2013.01); *H01L 23/49568* (2013.01); *H01L 23/49827* (2013.01); *H01L 23/49838* (2013.01); *H01L 24/03* (2013.01); *H01L 24/05* (2013.01); *H01L 24/06* (2013.01); *H01L 24/09* (2013.01); *H01L 24/33* (2013.01); *H01L 24/49* (2013.01);
(Continued)

(58) Field of Classification Search
CPC ..... H01L 24/85; H01L 23/345; H01L 24/06; H01L 23/3107; H01L 24/49; H01L 21/56; H01L 24/33; H01L 23/49568; H01L 23/481; H01L 24/45; H01L 23/49503; H01L 23/49548; H01L 23/28; H01L 23/49541
See application file for complete search history.

(56) References Cited

U.S. PATENT DOCUMENTS 6,054,759 A    4/2000   Nakamura
7,548,430 B1   6/2009   Huemoeller et al.
(Continued)

OTHER PUBLICATIONS

ACTEL, "Assembly and PCB Layout Guidelines for QFN Packages," May 2008, pp. 1-15 See Priority U.S. Appl. No. 14/547,459, filed Nov. 19, 2014.

*Primary Examiner* — Alonzo Chambliss
(74) *Attorney, Agent, or Firm* — Allen, Dyer, Doppelt, Milbrath & Gilchrist, P.A.

(57) ABSTRACT

An electronic device may include leads, an IC having first and second bond pads, and an encapsulation material adjacent the leads and the IC so the leads extend to a bottom surface of the encapsulation material defining first contact pads. The electronic device may include bond wires between the first bond pads and corresponding ones of the leads, and conductors extending from corresponding ones of the second bond pads to the bottom surface of the encapsulation material defining second contact pads.

24 Claims, 4 Drawing Sheets

(51) Int. Cl.
*H01L 23/48* (2006.01)
*H01L 23/433* (2006.01)
*H01L 23/367* (2006.01)
*H01L 23/498* (2006.01)
*H01L 23/28* (2006.01)
*H01L 23/31* (2006.01)
*H01L 21/56* (2006.01)

(52) U.S. Cl.
CPC .............. *H01L 24/73* (2013.01); *H01L 24/85* (2013.01); *H01L 24/92* (2013.01); *H01L 21/561* (2013.01); *H01L 23/28* (2013.01); *H01L 23/3107* (2013.01); *H01L 24/16* (2013.01); *H01L 24/45* (2013.01); *H01L 24/48* (2013.01); *H01L 24/81* (2013.01); *H01L 24/83* (2013.01); *H01L 2224/03003* (2013.01); *H01L 2224/03334* (2013.01); *H01L 2224/0401* (2013.01); *H01L 2224/04042* (2013.01); *H01L 2224/04105* (2013.01); *H01L 2224/06102* (2013.01); *H01L 2224/06131* (2013.01); *H01L 2224/09151* (2013.01); *H01L 2224/12105* (2013.01); *H01L 2224/16238* (2013.01); *H01L 2224/32245* (2013.01); *H01L 2224/45124* (2013.01); *H01L 2224/45147* (2013.01); *H01L 2224/48091* (2013.01); *H01L 2224/48106* (2013.01); *H01L 2224/48247* (2013.01); *H01L 2224/49175* (2013.01); *H01L 2224/73207* (2013.01); *H01L 2224/73253* (2013.01); *H01L 2224/73265* (2013.01); *H01L 2224/81815* (2013.01); *H01L 2224/85* (2013.01); *H01L 2224/92127* (2013.01); *H01L 2224/92242* (2013.01); *H01L 2224/92247* (2013.01); *H01L 2924/00014* (2013.01); *H01L 2924/14* (2013.01); *H01L 2924/181* (2013.01)

(56) References Cited

U.S. PATENT DOCUMENTS

| | | |
|---|---|---|
| 7,898,067 B2 | 3/2011 | Jereza |
| 7,960,827 B1 | 6/2011 | Miller et al. |
| 8,008,132 B2 | 8/2011 | Upadhyayula et al. |
| 8,193,555 B2 | 6/2012 | Lin et al. |
| 8,304,277 B2 | 11/2012 | Pagaila |
| 8,304,871 B2 | 11/2012 | Yu et al. |
| 8,362,601 B2 | 1/2013 | Camacho et al. |
| 8,441,113 B2 | 5/2013 | Lee |
| 8,456,856 B2 | 6/2013 | Lin et al. |
| 8,470,644 B2 | 6/2013 | Yu et al. |
| 2006/0065972 A1 | 3/2006 | Khan et al. |
| 2007/0130759 A1 | 6/2007 | Harnden et al. |
| 2009/0072365 A1 | 3/2009 | Tay et al. |
| 2009/0166825 A1 | 7/2009 | Camacho et al. |
| 2009/0166828 A1 | 7/2009 | Upadhyayula et al. |
| 2009/0261461 A1 | 10/2009 | Sapp et al. |
| 2010/0109134 A1 | 5/2010 | Jereza |
| 2010/0127360 A1 | 5/2010 | Pagaila et al. |
| 2010/0140764 A1 | 6/2010 | Camacho et al. |
| 2010/0200898 A1 | 8/2010 | Lin et al. |
| 2010/0246152 A1 | 9/2010 | Lin et al. |
| 2011/0309485 A1 | 12/2011 | Upadhyayula et al. |
| 2012/0061822 A1 | 3/2012 | Pagaila |
| 2012/0181676 A1 | 7/2012 | Tsui et al. |
| 2012/0181677 A1 | 7/2012 | Tsui et al. |
| 2012/0228681 A1 | 9/2012 | Lin et al. |
| 2012/0256306 A1 | 10/2012 | Yu et al. |
| 2013/0009297 A1 | 1/2013 | Tsui et al. |
| 2013/0015577 A1 | 1/2013 | Pagaila |
| 2013/0017652 A1 | 1/2013 | Tsui et al. |
| 2013/0034937 A1 | 2/2013 | Yu et al. |
| 2013/0242500 A1 | 9/2013 | Lin et al. |

ELECTRONIC DEVICE WITH FIRST AND SECOND CONTACT PADS AND RELATED METHODS

TECHNICAL FIELD

The present disclosure relates to the field of electronic devices, and, more particularly, to integrated circuits and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via wire bonds or solder bumps.

One approach to IC packaging comprises a quad-flat no-leads (QFN) package. The OFM may provide some advantages, such as reduced lead inductance, a near chip scale footprint, thin profile, and low weight. Also, the QFN package typically includes perimeter I/O pads to ease circuit board trace routing, and the exposed copper die-pad technology offers enhanced thermal and electrical performance. QFN packaging may be well suited for applications where size, weight, and thermal and electrical performance are important.

Referring to FIG. 1, a typical QFN packaged electronic device 90 is now described. The electronic device 90 includes a plurality of leads 93a-93k, and a medially placed heat sink 91 adjacent thereto. The electronic device 90 includes an adhesive layer 96 on the heat sink 91, an IC 92 on the adhesive layer, and a plurality of wire bonds 97a-97k coupling the IC to the plurality of leads 93a-93k. The electronic device 90 also includes an encapsulation material 95 surrounding the IC 92, the plurality of wire bonds 97a-97k, and the plurality of leads 93a-93k. This electronic device 90 may have some drawbacks. In particular, the IC 92 includes a single row of band pads 81a-81k at a periphery thereof, thereby providing limited connections.

SUMMARY

An electronic device comprises a plurality of leads, and an IC comprising first and second pluralities of bond pads. The electronic device also includes an encapsulation material adjacent the plurality of leads and the IC so the plurality of leads extends to a bottom surface of the encapsulation material defining a first plurality of contact pads, a plurality of bond wires between the first plurality of bond pads and corresponding ones of the plurality of leads, and a plurality of conductors extending from corresponding ones of the second plurality of bond pads to the bottom surface of the encapsulation material defining a second plurality of contact pads. Advantageously, the electronic device may provide a QFN package with a mixed interconnect technique.

In particular, the first plurality of contact pads may be arranged around a periphery of the bottom surface of the encapsulation material. The second plurality of contact pads may be arranged on a medial portion of the bottom surface of the encapsulation material. The first plurality of bond pads may be arranged around a periphery of a top surface of the IC, and the second plurality of bond pads may be arranged on a medial portion of the top surface of the IC.

Also, the electronic device may further comprise a heat sink exposed on a top surface of the encapsulation material. The IC may be coupled to the heat sink. The first and second pluralities of bond pads may be on the top surface of the IC, and the IC may have a bottom surface coupled to the heat sink.

In some embodiments, each of the plurality of conductors may comprise an elongate conductor. In other embodiments, the plurality of conductors may comprise an interposer. The interposer may comprise a semiconductor substrate and a plurality of conductive vias extending therethrough. The plurality of conductors may further comprise a plurality of solder bodies between the second plurality of bond pads and the interposer. Each of the plurality of leads may have a sidewall exposed on a corresponding side of the encapsulation material.

Another aspect is directed to a method for making an electronic device. The method may comprise coupling a plurality of wire bonds between a first plurality of bond pads of an IC and corresponding ones of a plurality of leads, coupling a plurality of conductors to extend outwardly from a second plurality of bond pads of the IC, and forming an encapsulation material adjacent the plurality of leads and the IC so the plurality of leads extends to a bottom surface of the encapsulation material defining a first plurality of contact pads, and so that the plurality of conductors extends to the bottom surface defining a second plurality of contact pads.

DETAILED DESCRIPTION

The present embodiments will now be described more fully hereinafter with reference to the accompanying drawings, in which preferred embodiments of the present disclosure are shown. This present embodiments may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime and double prime notation are used to indicate similar elements in alternative embodiments.

Figure 1:
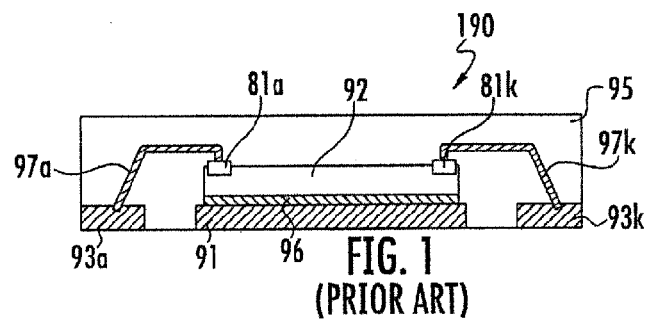
FIG. 1 is a schematic diagram of a cross sectional view of an electronic device, according to the prior art.
Figure 2:
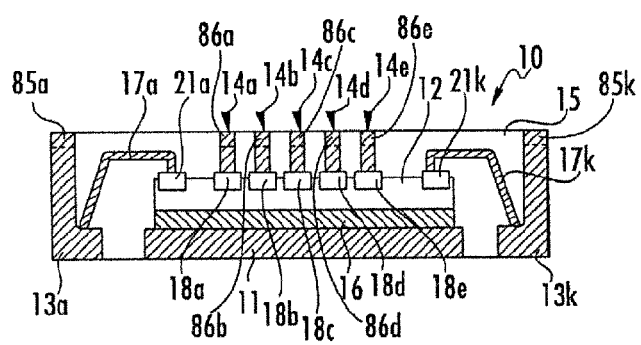
FIG. 2 is a schematic diagram of a cross sectional view of an electronic device, according to the present disclosure.
Figure 3A:
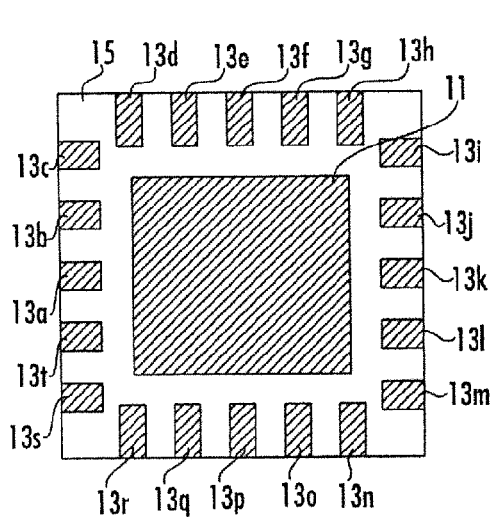
FIGS. 3A-3B are top and bottom plan views of the electronic device of FIG. 2.
Figure 3B:
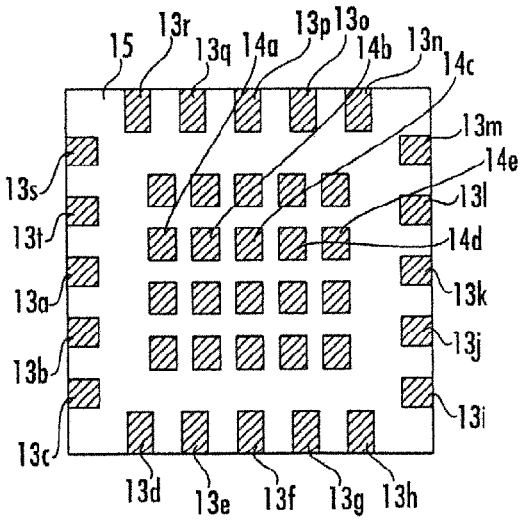

Referring to FIGS. 2-3B, an electronic device 10 according to the present disclosure is now described. The electronic device 10 illustratively includes a plurality of leads 13a-13t, and an IC 12 positioned within the plurality of leads. The plurality of leads 13a-13t comprises an electrically conductive material, for example, copper or aluminum. The IC 12 illustratively includes first 21a-21k and second 18a-18e pluralities of bond pads (e.g. copper, aluminum). The first plurality of bond pads 21a-21k is arranged around a periphery of a top surface of the IC 12, and the second plurality of bond pads 18a-18e is arranged on a medial portion of the top surface of the IC.

The electronic device 10 also includes an encapsulation material 15 adjacent the plurality of leads 13a-13t and the IC 12. In particular, the encapsulation material 15 fills in the area between the leads 13a-13t, thereby surrounding the IC 12. As perhaps best seen in FIG. 3B, the encapsulation material 15 is formed so the plurality of leads 13a-13t extends to a bottom surface of the encapsulation material defining a first plurality of contact pads 85a, 85k. The first plurality of contact pads 85a, 85k is arranged around a periphery of the bottom surface of the encapsulation material 15. Each of the plurality of leads 13a-13t illustratively has a sidewall exposed on a corresponding side of the encapsulation material 15. Also, as perhaps best seen in FIG. 3A, the plurality of leads 13a-13t also extends to a top surface of the encapsulation material 15, thereby providing access to the first plurality of contact pads 85a, 85k on either side of the electronic device 10.

The electronic device 10 includes a plurality of bond wires 17a-17k (e.g. copper, aluminum) between the first plurality of bond pads 21a-21k and corresponding ones of the plurality of leads 13a-13t, and a plurality of conductors 14a-14e extending from corresponding ones of the second plurality of bond pads 18a-18e to the bottom surface of the encapsulation material 15 defining a second plurality of contact pads 86a-86e (FIG. 2). In the illustrated embodiment, each of the plurality of conductors 14a-14e comprises an elongate conductor, for example, an electrically conductive via made from copper or aluminum. The second plurality of contact pads 86a-86e is arranged on a medial portion of the bottom surface of the encapsulation material 15 (i.e. being within the first plurality of contact pads).

Also, the electronic device 10 illustratively includes a heat sink 11 exposed on a top surface of the encapsulation material 15. In the illustrated embodiment, the electronic device 10 includes a layer of thermally conductive adhesive material 16 between the heat sink 11 and the IC 12 for coupling the two together. As noted above, the first 21a-21k and second 18a-18e pluralities of bond pads may be on the top surface of the IC 12 while the bottom surface of the IC is coupled to the heat sink 11.

Figure 4:
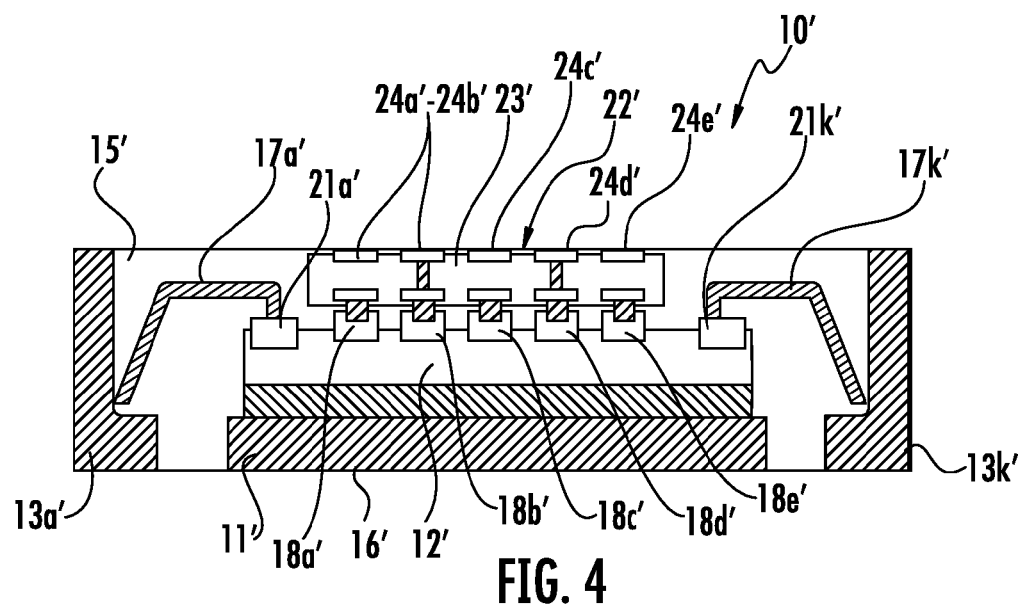
FIGS. 4-5 are schematic diagrams of cross sectional views of other embodiments of the electronic device, according to the present disclosure.

Referring now additionally to FIG. 4, another embodiment of the electronic device 10' is now described. In this embodiment of the electronic device 10', those elements already discussed above with respect to FIGS. 2-3B (13a', 11', 12', 15', 16', 17a', 12', 13k', 17k', 21a', 21k') are given prime notation and most require no further discussion herein. This embodiment differs from the previous embodiment in that this electronic device 10' has the plurality of conductors comprising an interposer 22'. The interposer 22' illustratively includes a semiconductor substrate 23', and a plurality of conductive vias 24a'-24e' (e.g. copper, aluminum) extending therethrough. The interposer 22' may be coupled to the second pluralities of bond pads 18a'-18e' using electrically conductive paste or reflow solder. Also, the semiconductor substrate 23' may comprise a silicon substrate, an organic substrate, or a ceramic substrate.

Figure 5:
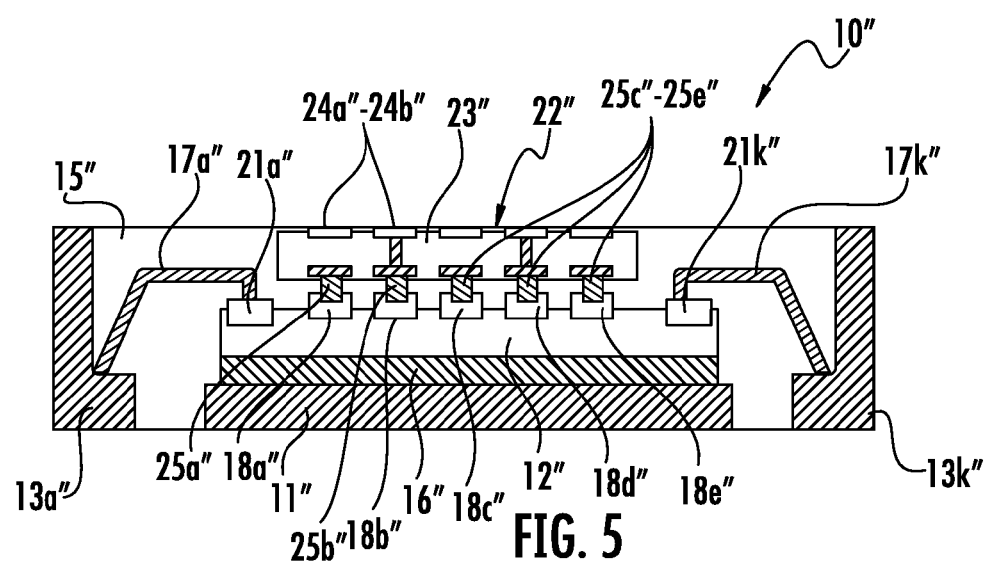
Figure 6A:
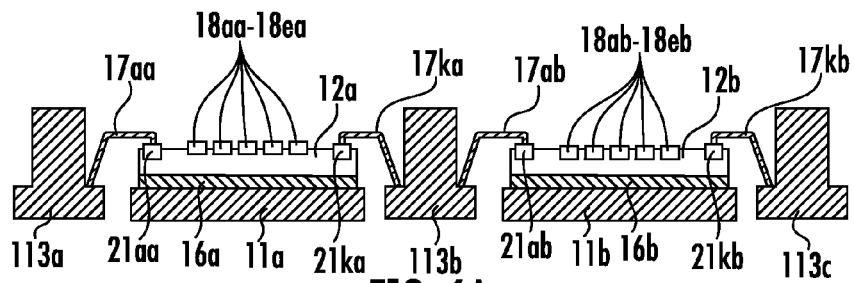
FIGS. 6A-6E are schematic diagrams of cross sectional views of steps in a method for making the electronic device of FIG. 2.
Figure 6B:
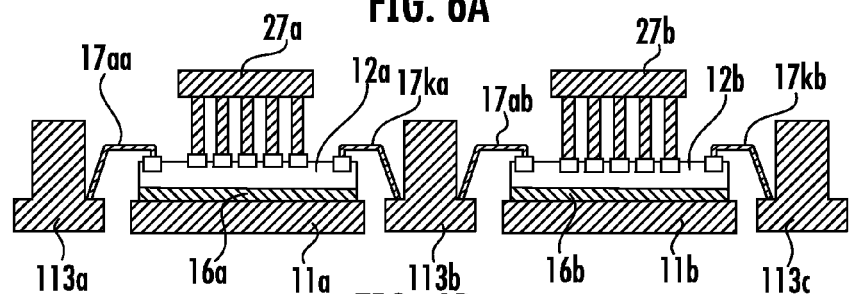
Figure 6C:
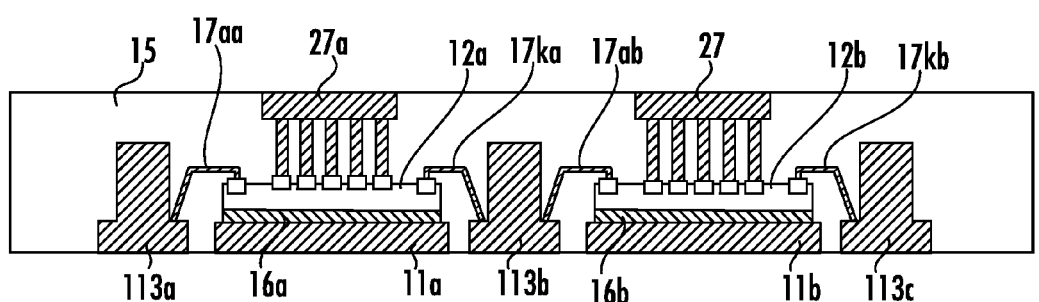
Figure 6D:
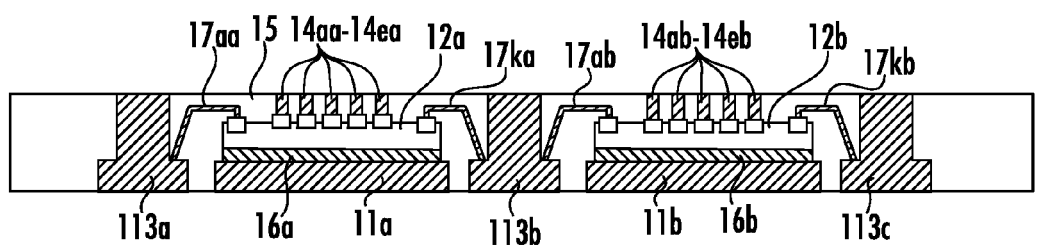
Figure 6E:
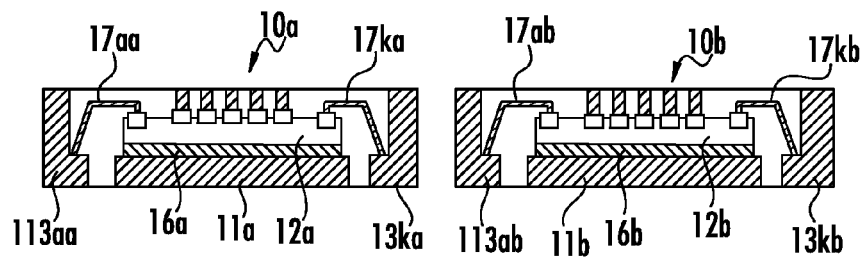
Figure 7A:
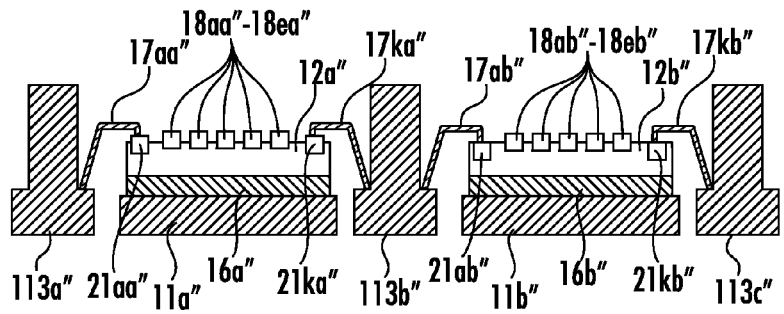
FIGS. 7A-7D are schematic diagrams of cross sectional views of steps in a method for making the electronic device of FIG. 5.
Figure 7B:
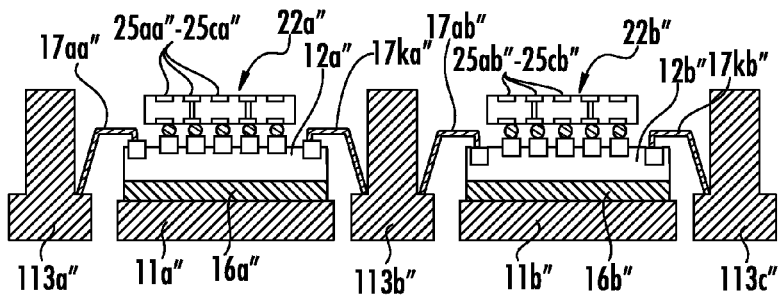
Figure 7C:
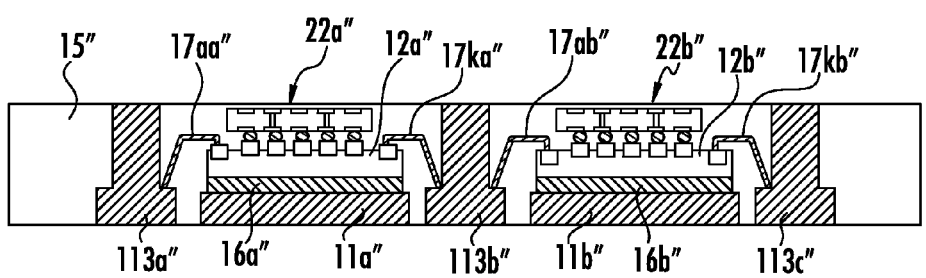
Figure 7D:
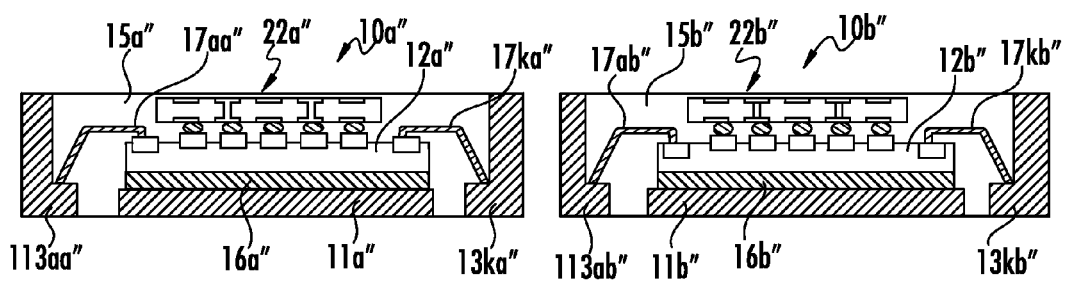

Referring now additionally to FIG. 5, another embodiment of the electronic device 10" is now described. In this embodiment of the electronic device 10", those elements already discussed above with respect to FIGS. 2-3B (15", 13a"-13k", 16", 21a", 11", 16", 12", 17a"-17k", 10", 21a"-21k", 24a"-24b", 22", 23", 17aa"-17kb", 12a"-12b", 113a", 21aa"-21kb", 11a"-11b", 16a"-16b", 25aa"-25cb", 22a"-22b", 13aa", 13ab", 13ka", 13kb", 15a", 18aa"-18eb") are given double prime notation and most require no further discussion herein. This embodiment differs from the previous embodiment in that this electronic device 10" has the plurality of conductors further comprising a plurality of solder bodies 25a"-25e" between the second plurality of bond pads 18a"-18e" and the interposer 22".

Another aspect is directed to a method for making an electronic device 10. The method may comprise coupling a plurality of wire bonds 17a-17k between a first plurality of bond pads 21a-21k of an IC 12 and corresponding ones of a plurality of leads 13a-13t, coupling a plurality of conductors 14a-14e to extend outwardly from a second plurality of bond pads 18a-18e of the IC, and forming an encapsulation material 15 adjacent the plurality of leads and the IC so the plurality of leads extends to a bottom surface of the encapsulation material defining a first plurality of contact pads 85a, 85k, and so that the plurality of conductors extends to the bottom surface defining a second plurality of contact pads 86a-86e.

Advantageously, the electronic device 10 may provide a QFN packaged device with a mixed interconnect technique, i.e. providing both wire bonds 17a-17k and electrically conductive vias 14a-14e for coupling to the IC 12. The electronic device 10 also provides multiple rows of contacts, which increase the die to package ratio. Moreover, the electronic device 10 is readily stackable and provides improved thermal performance over existing approaches.

Referring now additionally to FIGS. 6A-6E, a method for making the electronic device 10 of FIG. 2 is now described. In the illustrated embodiment, the method manufactures first and second electronic devices 10a, 10b (FIG. 6E), but it should be appreciated that via wafer level processing techniques, the method can be expanded for simultaneous manufacture of a large number of devices (i.e. much greater than the illustrated two). The method illustratively includes positioning stacks of the ICs 12a-12b, the heat sinks 11a-11b, and the adhesive material 16a-16b therebetween. The plurality of leads 113a-113c is positioned to surround the stacks. The method includes forming the pluralities of the wire bonds 17aa-17ka, 17ab-17kb between the ICs 12a-12b and the plurality of leads 113a-113c.

The method illustratively includes coupling a conductive frame 27a-27b (e.g. copper, aluminum) onto the respective stacks. In particular, the conductive frames 27a-27b each comprises a head portion, and a plurality of legs extending therefrom. The legs of the conductive frame 27a-27b are aligned with the second plurality of bond pads 18aa-18ea, 18ab-18eb for the first and second ICs 12a-12b. The method may include applying electrically conductive paste between the legs of the conductive frame 27a-27b and the second plurality of bond pads 18aa-18ea, 18ab-18eb. Helpfully, the head portion provides a readily graspable portion for aiding assembly, for example, using a pick-and-place machine.

The method illustratively includes forming the encapsulation material 15 to surround the stacks and the leads 113a-113c. The method illustratively includes grinding down a surface of the encapsulation material 15, which forms the lower surface of the electronic devices 10a-10b, so that the legs of the conductive frame 27a-27b remain (i.e. severing portions of the conductive frame 27a-27b to define the plurality of conductors 14aa-14ea, 14ab-14eb). The legs of the conductive frame 27a-27b define the plurality of conductors 14aa-14ea, 14ab-14eb in the electronic devices 10a-10b. The method illustratively includes a singulation step where, for example, a blade cuts the piece along a midpoint of the leads 113a-113c.

Referring now additionally to FIGS. 7A-7D, a method for making the electronic device 10" of FIG. 5 is now described. In the illustrated embodiment, the method manufactures first and second electronic devices 10a", 10b" (FIG. 7D), but it should be appreciated that via wafer level processing techniques, the method can be expanded for simultaneous manufacture of a large number of devices.

The method illustratively includes positioning the stacks of the ICs 12a"-12b", the heat sinks 11a"-11b", and the adhesive material 16a"-16b" therebetween. The plurality of leads 113a"-113c" is positioned to surround the stacks. The method includes forming the pluralities of the wire bonds 17aa"-17ka", 17ab"-17kb" between the ICs 12a"-12b" and the plurality of leads 113a"-113c". The method illustratively includes forming a plurality of solder bodies 25aa"-25ea", 25ab"-25eb" on the second plurality of bond pads 18aa"-18ea", 18ab"-18eb" of the ICs 12a"-12b". The method also includes positioning the interposers 22a"-22b" on the plurality of solder bodies 25aa"-25ea", 25ab"-25eb".

The method illustratively includes forming the encapsulation material 15" to surround the stacks, the leads 113a"-113c", and the interposers 22a"-22b". The method illustratively includes a singulation step where a blade cuts the piece along the midpoint of the leads 113a"-113c".

Many modifications and other embodiments of the present disclosure will come to the mind of one skilled in the art having the benefit of the teachings presented in the foregoing descriptions and the associated drawings. Therefore, it is understood that the present embodiments are not to be limited to the specific embodiments disclosed, and that modifications and embodiments are intended to be included within the scope of the appended claims.

That which is claimed is:

1. An electronic device comprising:
a plurality of leads;
an integrated circuit (IC) comprising first and second pluralities of bond pads, said first plurality of bond pads being around said second plurality of bond pads;
an encapsulation material adjacent said plurality of leads and said IC so said plurality of leads extends to a bottom surface of said encapsulation material with lowermost portions defining a first plurality of contact pads;
a plurality of bond wires between said first plurality of bond pads and corresponding ones of said plurality of leads; and
a plurality of conductors extending from corresponding ones of said second plurality of bond pads to the bottom surface of said encapsulation material defining a second plurality of contact pads;
said first and second pluralities of contact pads being aligned with each other adjacent the bottom surface of said encapsulation material.

2. The electronic device of claim 1 wherein the first plurality of contact pads is arranged around a periphery of the bottom surface of said encapsulation material.

3. The electronic device of claim 1 wherein the second plurality of contact pads is arranged on a medial portion of the bottom surface of said encapsulation material.

4. The electronic device of claim 1 wherein said first plurality of bond pads are arranged around a periphery of a top surface of said IC; and wherein said second plurality of bond pads are arranged on a medial portion of the top surface of said IC.

5. The electronic device of claim 1 further comprising a heat sink exposed on a top surface of said encapsulation material; and wherein said IC is coupled to said heat sink.

6. The electronic device of claim 5 wherein said first and second pluralities of bond pads are on a top surface of said IC; and wherein said IC has a bottom surface coupled to said heat sink.

7. The electronic device of claim 1 wherein each of said plurality of conductors comprises an elongate conductor.

8. The electronic device of claim 1 wherein said plurality of conductors comprises an interposer.

9. The electronic device of claim 8 wherein said interposer comprises a semiconductor substrate, and a plurality of conductive vias extending therethrough.

10. The electronic device of claim 8 wherein said plurality of conductors further comprises a plurality of solder bodies between said second plurality of bond pads and said interposer.

11. The electronic device of claim 1 wherein each of said plurality of leads has a sidewall exposed on a corresponding side of said encapsulation material.

12. An electronic device comprising:
a plurality of leads;
an integrated circuit (IC) comprising first and second pluralities of bond pads, said first plurality of bond pads being around said second plurality of bond pads;
an encapsulation material adjacent said plurality of leads and said IC so said plurality of leads extends to a bottom surface of said encapsulation material with lowermost portions defining a first plurality of contact pads arranged adjacent a periphery of the bottom surface;
a plurality of bond wires between said first plurality of bond pads and corresponding ones of said plurality of leads; and
a plurality of conductors extending from said second plurality of bond pads to the bottom surface of said encapsulation material defining a second plurality of contact pads arranged within the plurality of first contact pads;
said first and second pluralities of contact pads being aligned with each other adjacent the bottom surface of said encapsulation material.

13. The electronic device of claim 12 further comprising a heat sink exposed on a top surface of said encapsulation material; and wherein said IC is coupled to said heat sink.

14. The electronic device of claim 12 wherein each of said plurality of conductors comprises an elongate conductor.

15. The electronic device of claim 12 wherein said plurality of conductors comprises an interposer.

16. The electronic device of claim 12 wherein each of said plurality of leads has a sidewall exposed on a corresponding side of said encapsulation material.

17. A method for making an electronic device comprising:
coupling a plurality of wire bonds between a first plurality of bond pads of an integrated circuit (IC) and corresponding ones of a plurality of leads;
coupling a plurality of conductors to extend outwardly from a second plurality of bond pads of the IC, the first plurality of bond pads being around the second plurality of bond pads; and
forming an encapsulation material adjacent the plurality of leads and the IC so the plurality of leads extend to a bottom surface of the encapsulation material with lowermost portions defining a first plurality of contact pads;

the plurality of conductors extending to the bottom surface of the encapsulation material and defining a second plurality of contact pads aligned with the first plurality of contact pads adjacent the bottom surface of the encapsulation material.

18. The method of claim 17 wherein the first plurality of contact pads is arranged around a periphery of the bottom surface of the encapsulation material.

19. The method of claim 17 wherein the second plurality of contact pads is arranged on a medial portion of a top surface of the encapsulation material.

20. The method of claim 17 further comprising positioning a heat sink to be coupled to the IC and exposed on a top surface of the encapsulation material.

21. The method of claim 17 further comprising coupling a conductive frame to the second plurality of bond pads, and severing portions of the conductive frame to define the plurality of conductors.

22. The method of claim 17 further comprising positioning an interposer to be coupled to the second plurality of bond pads to define the plurality of conductors.

23. The method of claim 17 wherein the plurality of leads are initially part of a lead frame.

24. The method of claim 17 further comprising exposing a sidewall of each of the plurality of leads on a corresponding side of the encapsulation material.

* * * * *